United States Patent
Tailliet

(10) Patent No.: US 10,727,239 B2
(45) Date of Patent: Jul. 28, 2020

(54) COMPACT EEPROM MEMORY CELL WITH A GATE DIELECTRIC LAYER HAVING TWO DIFFERENT THICKNESSES

(71) Applicant: STMicroelectronics (Rousset) SAS, Rousset (FR)

(72) Inventor: François Tailliet, Fuveau (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/130,593

(22) Filed: Sep. 13, 2018

(65) Prior Publication Data

US 2019/0088665 A1 Mar. 21, 2019

(30) Foreign Application Priority Data

Sep. 20, 2017 (FR) ..................... 17 58697

(51) Int. Cl.

| H01L 27/11517 | (2017.01) |
|---|---|
| H01L 29/423 | (2006.01) |
| G11C 7/18 | (2006.01) |
| H01L 29/66 | (2006.01) |
| G11C 16/04 | (2006.01) |
| H01L 21/28 | (2006.01) |
| H01L 27/11524 | (2017.01) |
| H01L 29/788 | (2006.01) |
| G11C 16/08 | (2006.01) |
| G11C 16/24 | (2006.01) |

(52) U.S. Cl.
CPC ......... *H01L 27/11517* (2013.01); *G11C 7/18* (2013.01); *G11C 16/0433* (2013.01); *G11C 16/08* (2013.01); *G11C 16/24* (2013.01); *H01L 27/11524* (2013.01); *H01L 29/40114* (2019.08); *H01L 29/4236* (2013.01); *H01L 29/42324* (2013.01); *H01L 29/42328* (2013.01); *H01L 29/42336* (2013.01); *H01L 29/42368* (2013.01); *H01L 29/42376* (2013.01); *H01L 29/66825* (2013.01); *H01L 29/7881* (2013.01)

(58) Field of Classification Search
None
See application file for complete search history.

(56) References Cited

U.S. PATENT DOCUMENTS

| 4,203,158 A * | 5/1980 | Frohman-Bentchkowsky ............ H01L 27/115 257/321 |
| 4,958,321 A * | 9/1990 | Chang ............... G11C 16/0416 257/E29.306 |

(Continued)

FOREIGN PATENT DOCUMENTS

FR 2987697 A1 9/2013

*Primary Examiner* — J. H. Hur
(74) *Attorney, Agent, or Firm* — Slater Matsil, LLP

(57) ABSTRACT

An EEPROM memory integrated circuit includes memory cells arranged in a memory plane. Each memory cell includes an access transistor in series with a state transistor. Each access transistor is coupled, via its source region, to the corresponding source line and each state transistor is coupled, via its drain region, to the corresponding bit line. The floating gate of each state transistor rests on a dielectric layer having a first part with a first thickness, and a second part with a second thickness that is less than the first thickness. The second part is located on the source side of the state transistor.

22 Claims, 8 Drawing Sheets

(56) References Cited

U.S. PATENT DOCUMENTS

| | | | |
|---|---|---|---|
| 5,235,544 A * | 8/1993 | Caywood | G11C 16/14 |
| | | | 257/322 |
| 5,646,060 A * | 7/1997 | Chang | H01L 27/115 |
| | | | 257/E27.103 |
| 6,169,307 B1 * | 1/2001 | Takahashi | G11C 16/0416 |
| | | | 257/315 |
| 6,888,190 B2 * | 5/2005 | Yang | H01L 27/115 |
| | | | 257/314 |
| 2002/0175394 A1 | 11/2002 | Wu et al. | |
| 2004/0042298 A1 * | 3/2004 | Hideki | G11C 13/0004 |
| | | | 365/202 |
| 2005/0042833 A1 * | 2/2005 | Park | H01L 29/66553 |
| | | | 438/282 |
| 2009/0186460 A1 | 7/2009 | Niel | |
| 2009/0190402 A1 * | 7/2009 | Hsu | G11C 14/00 |
| | | | 365/185.08 |
| 2013/0229875 A1 * | 9/2013 | La Rosa | H01L 29/7881 |
| | | | 365/185.21 |
| 2016/0155506 A1 * | 6/2016 | Tailliet | G11C 16/0408 |
| | | | 365/185.05 |
| 2018/0033487 A1 * | 2/2018 | Tailliet | G11C 16/0433 |

* cited by examiner

| | WL | Bit | CG T | BL | S L | WL |
|---|---|---|---|---|---|---|
| EFF | Not sel | 0 | -2 | 0 | 0 | 0 |
| | | 1 | -2 | 0 | 0 | 0 |
| | Sel | 0 | -15 | 0 | 0 | 0 |
| | | 1 | -15 | 0 | 0 | 0 |

| | WL | Bit | CG T | BL | S L | WL |
|---|---|---|---|---|---|---|
| PRG | Not sel | 0 | 3 | 5 | 1 | 0 |
| | | 1 | 3 | 0 | 1 | 0 |
| | Sel | 0 | 15 | 5 | 1 | 0 |
| | | 1 | 15 | 0 | 1 | 0 |

# COMPACT EEPROM MEMORY CELL WITH A GATE DIELECTRIC LAYER HAVING TWO DIFFERENT THICKNESSES

CROSS-REFERENCE TO RELATED APPLICATIONS

This application claims priority to French Patent Application No. 1758697, filed on Sep. 20, 2017, which application is hereby incorporated herein by reference.

TECHNICAL FIELD

Embodiments and modes of implementation relate to compact electrically erasable and programmable non-volatile memory (EEPROM).

BACKGROUND

Non-volatile memory technologies are divided in particular into two main categories, EEPROM memory and flash memory. Each category has its advantages and its drawbacks. For example, flash memory has the advantages of having very small memory cells, block granularity, and a fast access time, but the drawbacks of being less durable than EEPROM, of having complex peripheral algorithm circuits, and of consuming a substantial amount of energy for writing. As regards EEPROM memory, in particular page-accessible EEPROM memory, it has in particular the advantages of having high durability, simpler peripheral circuitry, a first access time, page granularity, lower energy consumption for writing, its main drawback being that its memory cells are bulkier.

Consequently, due to the respective sizes of the peripheral circuits and of the memory cells, EEPROM memory is more compact than flash memory below a storage density ceiling. However, this ceiling is continually being raised, due to reductions in the size of electronic components in both technologies.

For example, this ceiling currently corresponds to a density of about 8 to 16 Mb.

It is therefore desirable to decrease the size of EEPROM memory cells further in order to benefit from their advantages in higher density memory.

EEPROM memory cells typically include an access transistor and a state transistor connected in series, the access transistor allowing the state transistor to be coupled to a bit line via its conduction terminals. The state transistor allows a charge representative of a logic datum to be stored in a non-volatile manner in its floating gate, the bit line allowing a memory cell to be selectively accessed for writing or reading.

A writing operation typically comprises an erasure followed by a programming operation. During the erasure, a positive high erasing voltage is applied to the control gate of the state transistor, injecting, via Fowler-Nordheim effect, an electron charge into the floating gate, from the source line, for example connected to ground. During the programming operation, a positive high programming voltage is applied to the drain of the state transistor, via the bit line and through the access transistor, extracting, via Fowler-Nordheim effect, the electron charge potentially stored in the floating gate.

The high programming voltage is for example of the order of 13 to 15 volts and the access transistor must be robust enough to transmit it, which is one cause of the greater bulk of EEPROM memory cells.

SUMMARY

According to one aspect, a memory device of electrically erasable and programmable non-volatile memory type is provided. The memory device is formed in and on a semiconductor substrate. A memory plane includes at least one memory cell comprising a state transistor having a source region, a drain region, a control gate and a floating gate, and an access transistor having a source region, a drain region and a gate, the source region of the access transistor being coupled to a source line. The drain region of the access transistor and the source region of the state transistor are common, the drain region of the state transistor is coupled to a bit line, the floating gate resting on a dielectric layer has a first part with a first thickness, and a second part with a second thickness that is less than the first thickness. The second part is located on the source region side of the state transistor.

A bit line allows a memory cell to be selectively accessed for writing or reading.

The second, thinner part of the dielectric layer, thus located on the source region side of the state transistor, may advantageously be located facing at least one part of the source region and one part of the zone located between the source region and the drain region of the state transistor. The formation of the second dielectric layer typically comprises a lithographic etching step; this configuration makes it possible to obtain a narrower injection window (i.e., the intersection of the floating gate and of the second dielectric layer) than when the etch is performed substantially in the middle of the zone located between the source region and the drain region, and for an etch of the same nature.

The state transistor may thus be more compact since the space between its source and its drain contains only part of the etch opening, instead of the complete etch opening.

For example, the dielectric layer includes a third part extending beyond the floating gate, located above the source region of the state transistor and having a thickness that is equal to the second thickness.

Furthermore, and as defined below, since each access transistor is coupled via its source region to the corresponding source line and each state transistor is coupled via its drain region to the corresponding bit line, the high erasing and programming voltages are not applied via the access transistor. This advantageously makes it possible to produce more compact access transistors, such as for example vertical gate transistors.

According to one embodiment, the integrated circuit comprises an erase circuit that is configured, during an erasure, to transmit an erasing voltage to the control gate of the state transistor, so as to place the state transistor in an on state.

Advantageously, the erase circuit is configured, during an erasure, to transmit a zero voltage to the gate of the access transistor, so as to order the access transistor to assume an off state.

The integrated circuit may also comprise programming circuit that is configured, during a programming operation, to transmit a programming voltage to the control gate of the state transistor, and, simultaneously, to transmit, over the bit line coupled to the drain of the state transistor, either a programming-inhibiting voltage so that the state transistor is not placed in an off state, or a programming-allowing voltage so as to place the state transistor in an off state.

The programming-inhibiting and programming-allowing voltages applied to the bit line are transmitted in the same way to the source of the state transistor, since the state transistor is forced into the on state by the high positive voltage applied to its control gate. This (programming-inhibiting or programming-allowing) voltage thus directly modulates the injected current.

Advantageously, the programming circuit is configured, during a programming operation, to transmit a zero voltage to the gate of the access transistor, so as to order the access transistor to assume an off state.

According to one embodiment, the memory plane includes a plurality of memory cells arranged in rows and in columns of memory words, each memory word including N memory cells on one and the same row, at least one source line coupled to the memory cells, N bit lines per column, each bit line being coupled to a memory cell of each memory word of one and the same column, one control gate line per column coupled to the control gates of the state transistors of the memory cells belonging to this column, and one word line per row coupled to the gates of the access transistors of the memory cells belonging to this row.

According to one embodiment, the erase circuit is configured, during an erasure, to transmit the erasing voltage over the control gate line that is coupled to the control gates of the state transistors of the memory cells of a group of memory cells.

According to one embodiment, the erase circuit is configured, during an erasure, to transmit the zero voltage over the word line that is coupled to the gates of the access transistors of the memory cells of the group of memory cells.

According to one embodiment, the programming circuit is configured, during a programming operation, to transmit the programming voltage over the control gate line that is coupled to the control gates of the state transistors of the memory cells of a group of memory cells, and, simultaneously, to transmit the programming-inhibiting voltage or the programming-allowing voltage over the bit lines that are respectively coupled to the memory cells of this group of memory cells.

According to one embodiment, the programming circuit is configured, during a programming operation, to transmit the zero voltage over the word line that is coupled to the gates of the access transistors of the memory cells of the group of memory cells.

According to one embodiment, each access transistor includes a first gate and a second gate which are superposed, according to a structure that is homologous to the structure of the part of the state transistor which is located facing the first dielectric layer, the first gate and the second gate furthermore being electrically connected.

The term "homologous structure" is understood to mean that the structures in question are of the same nature, including the same materials, being for example of the same thickness, such as the structures obtained by a common process at different sites.

According to one embodiment, each access transistor includes a vertical gate comprising an electrically conductive central portion enveloped by an insulating envelope in a trench, the source and drain regions of the access transistor being located on either side of the vertical gate at the surface of the substrate.

The insulating envelope thus forms a gate dielectric (or gate oxide) of the access transistor, separating the gate and the channel.

According to one embodiment, each access transistor includes a vertical gate comprising an electrically conductive central portion enveloped by an insulating envelope in a trench, the drain region of the access transistor being located at the surface of the substrate and the source region of the access transistor being located in a buried layer, buried at depth in the substrate, the buried layer forming the corresponding source line.

Likewise, the insulating envelope forms a gate dielectric (or gate oxide) of the access transistor, separating the gate and the channel.

Advantageously, the drain region of each access transistor is located on either side of the vertical gate at the surface of the substrate, and is connected in series with the source regions of two state transistors belonging respectively to two memory cells located on either side of the access transistor.

Each state transistor may further include a capacitive implanted region that is located below the second part of the dielectric layer and below a portion of the first part of the dielectric layer.

An electronic device, such as a mobile telephone, a hearing aid, a computer or the electronics of a vehicle or of a satellite, including a memory integrated circuit according to the invention, is also provided.

The embodiments thus defined make it possible to decrease the size of EEPROM memory cells while dealing with the stresses relating to high write voltages, such as leakages due to hot-carrier diffusion, non-destructive breakdown of PN junctions or gate dielectric wear.

BRIEF DESCRIPTION OF THE DRAWINGS

Other advantages and features of the invention will become apparent on examining the detailed description of wholly non-limiting embodiments and modes of implementation, and the appended drawings, in which.

DETAILED DESCRIPTION OF ILLUSTRATIVE EMBODIMENTS

Figure 1:
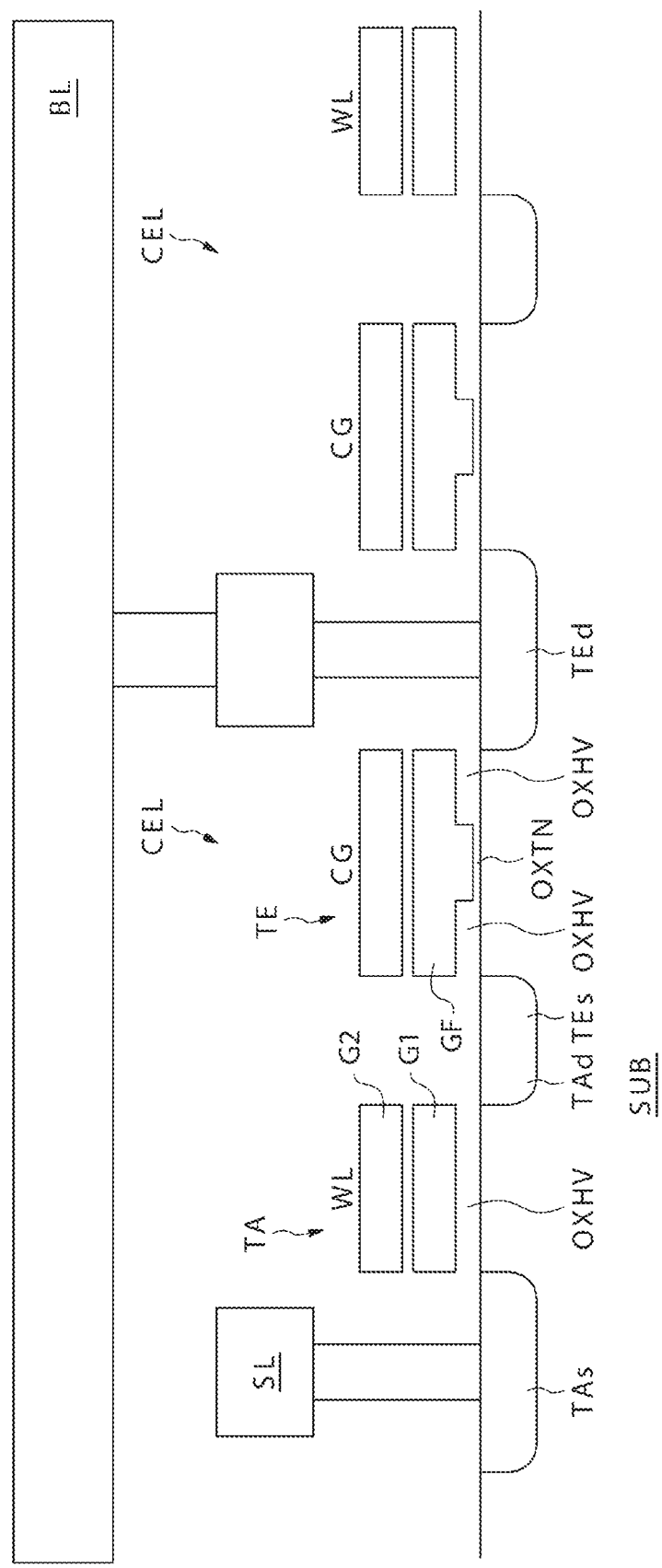
FIG. 1 illustrates a memory cell from my earlier patent.

FIG. 1 shows an exemplary EEPROM memory cell CEL architecture from French patent publication FR 3054723 and U.S. counterpart 2018/0033487, which are invented by me. This architecture includes, unlike typical memory cells, an access transistor TA connected between the source of the state transistor TE and a source line SL, the drain of the state transistor TE being connected directly to a bit line BL.

The access transistor TA includes a source region TAs and a drain region TAd, and, in this example, two gates G1, G2 which are electrically connected so as to have a single-gate transistor function.

This "backwards" architecture allows voltages to be applied to the bit line that are lower than the voltages applied to the bit line of a conventional EEPROM memory cell architecture. Decreasing the stresses to which the access transistor TA is typically subjected thus allows smaller access transistors TA to be produced.

Specifically, in this example, the erasures and the programming operations are implemented by voltages applied to the control gate of the state transistor TE and to the bit line BL which is directly connected to the drain of the state transistor TE.

The charge injection and extraction operations are performed via an injection window located substantially in the middle of the floating gate, halfway above the channel region between the source TEs and the drain TEd of the state transistor TE.

The injection window rests on a tunnel oxide layer OXTN, which is thinner than a gate oxide layer OXHV located on either side of the injection window.

First, the high programming and erasing voltages are not transmitted via the access transistor TA.

Second, the gates G1, G2 of the access transistor TA rest on a thickness of gate oxide OXHV, along with the floating gate GF of the state transistor TE on the source region TEs side and on the drain region TEd side.

The thickness of the gate oxide layers OXHV makes it possible to avoid hot-carrier leakage between the floating gate GF and the drain TEd of the state transistor TE, and to avoid premature wear due to stresses between the drain TAd and the gate G1 of the state transistor TA.

However, in the fabrication processes, the injection window is obtained by etching a first previously formed oxide layer, then by forming a second oxide layer OXTN in the etched zone and on the first oxide layer. The superposition of the first and of the second oxide layer forms the gate oxide layer OXHV, and the second oxide layer in the etched zone forms the thin tunnel oxide layer OXTN.

This etch is difficult to implement for small sizes of the opening of the injection window.

Specifically, it is preferable to perform a wet etch, for example for process optimization reasons, but this type of etch generally requires a thick masking resist which is incompatible with lithography at small dimensions.

For example, it is unrealistic to attempt to etch injection windows that are smaller than typically 0.34 µm (in the source-drain direction) using a simple wet-etch technique.

Techniques using hardmasks, for example made of silicon nitride, may make it possible to decrease the etching dimensions but may be complex and expensive to implement.

However, it is desirable to decrease the size of the opening of the injection window, for example to between 0.1 µm and 0.2 µm, in particular using a simple wet-etch technique. This would make it possible both to decrease the size of the state transistor (in the source-drain direction), and to improve the coupling factor of the memory cell (in order to limit the erasing and programming voltages to be applied).

Figure 2:
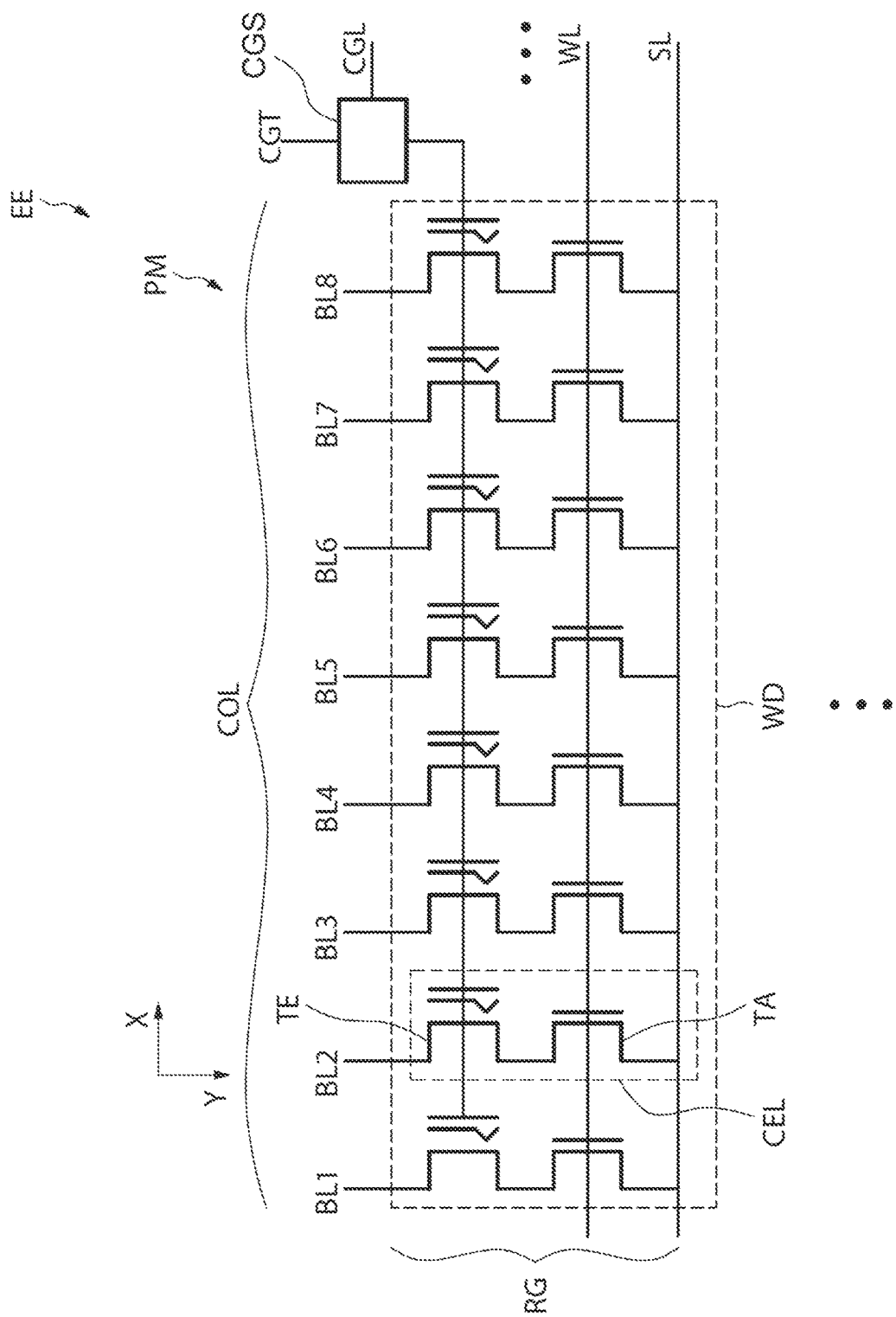
FIGS. 2 to 7 illustrate exemplary embodiments of the invention.

FIG. 2 shows a memory word WD belonging to a memory plane PM of an exemplary memory EE of electrically erasable and programmable non-volatile memory (EEPROM) type.

A memory word includes eight memory cells CEL, each including a floating gate transistor, referred to as a state transistor TE, and an access transistor TA.

The memory cells are arranged in rows RG and in columns COL of memory words WD in the memory plane PM.

A row RG includes a succession of memory words WD arranged in a first direction X, and a column COL includes a succession of memory words arranged in a second direction Y that is perpendicular to the first direction X.

To access the memory cells CEL of a column CEL, the memory plane PM is provided with N bit lines BLi per memory word ($1 \leq i \leq N$, where N=8 in this example) which are linked to one memory cell per memory word of one and the same column, and with control gates lines CGT that are coupled to the control gates of the state transistors TE of the memory words of a column via a control gate switch CGS that is dedicated to each memory word WD.

The control gate switch CGS includes for example an inverter circuit controlled by a control signal transmitted over a control gate switch CGS control line.

The control gate line CGT, transmitting a control gate signal to the control gates of the state transistors, may include for example a bus, in particular in the case of transmitting positive and negative voltages to the control gates.

To access the memory cells CEL of a row RG, the memory plane PM is provided with word lines WL that are linked to the gates of the access transistors TA of one and the same row, and with control gate switch control lines CGL that are linked to the control gate switches CGS dedicated to the memory words WD of a row.

A source line SL is furthermore common to the memory cells of one and the same row, to the memory cells of a group of rows, or to all of the memory cells of the memory plane.

The state transistor TE and the access transistor TA of each memory cell CEL are connected in series, between the source of the state transistor and the drain of the access transistor.

Each bit line BLi is coupled to the drain of the state transistor TE of the respective memory cell CEL, and the sources of the access transistors are coupled to the source line SL.

Figure 3:
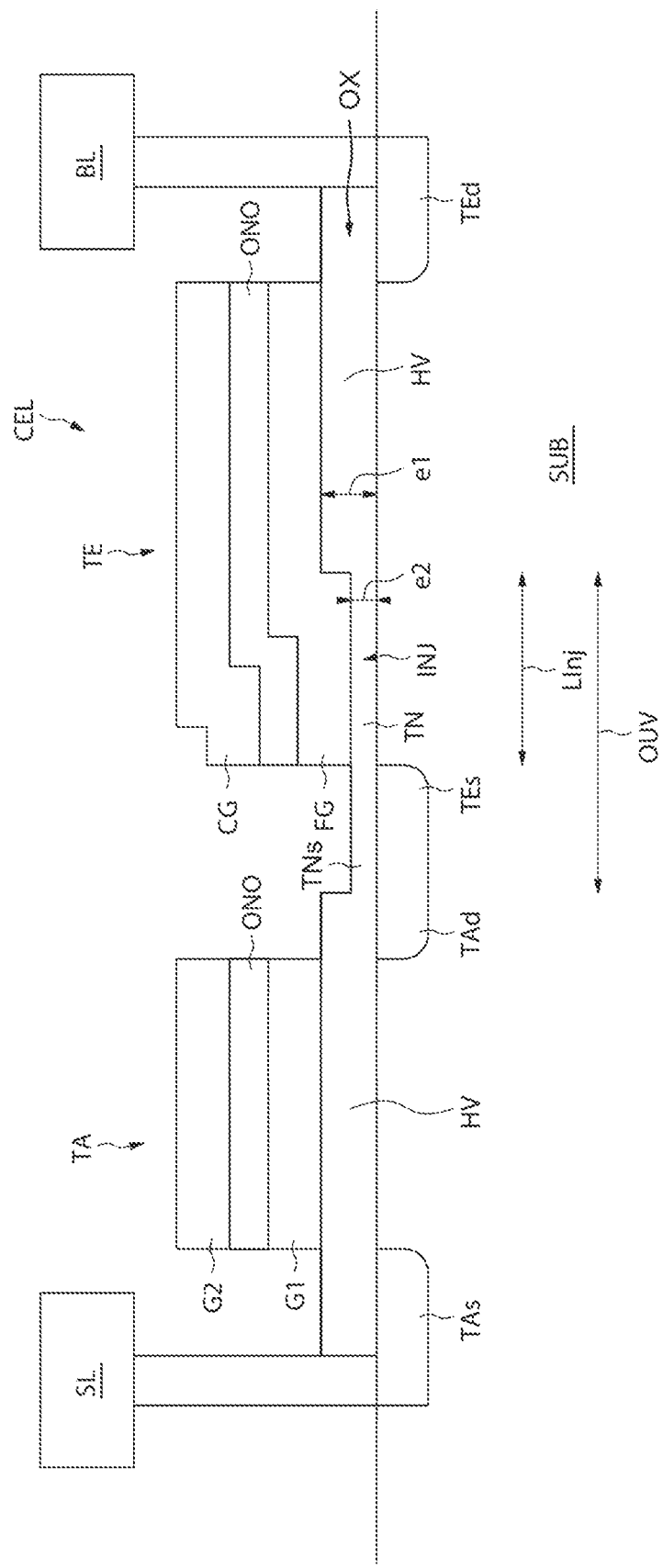

FIG. 3 shows a sectional view of one exemplary embodiment of a memory cell CEL.

The memory cell CEL includes an access transistor TA and a state transistor TE in series, formed in and on a semiconductor substrate SUB having a first conductivity type.

The memory cell CEL may also be formed in and on a semiconductor well for example of the first conductivity type and electrically insulated from the subjacent substrate by a semiconductor insulation region having the second conductivity type including a buried layer and lateral well isolations.

The state transistor TE comprises a semiconductor source region TEs and a semiconductor drain region TEd both having a second conductivity type opposite the first conductivity type, which are implanted at the surface of the substrate SUB. The zone at the surface of the substrate delimited by the source TEs and the drain TEd of the state transistor is referred to as the channel region of the state transistor TE.

The access transistor TA is coupled via its source region to a source line SL, and the state transistor TE is coupled via its drain region TEd to the corresponding bit line BL. The source TEs of the state transistor and the drain TAd of the access transistor are formed by an implanted region that is common to both transistors.

The state transistor TE includes a control gate CG surmounting a floating gate FG, which are electrically insulated from one another by a control gate dielectric layer ONO. The layer ONO typically includes for example an alternation of silicon nitride and silicon oxide layers.

The floating gate FG rests on a dielectric layer OX. The dielectric layer OX includes a first part HV having a first thickness e1 and a second part TN having a second thickness e2 that is less than the first thickness e1.

The second part TN of the dielectric layer OX is located on the source side of the state transistor TE.

In addition, the dielectric layer OX includes a third part TNs having the same thickness as the second thickness e2 of the second part TN.

The first thickness e1 corresponds to a thickness of high-voltage gate dielectric, for example around 20 nm to 25 nm, that is able for example to withstand voltages of around 20 V to 25 V without leakage and without premature wear.

The part of the channel region located facing the first part HV of the dielectric layer OX is referred to as the effective channel region. Specifically, it is this portion of the channel region which will define, during a read command, the on or off state of the state transistor TE, representing an erased or programmed state of the memory cell CEL, respectively.

The second thickness e2 corresponds to a thickness of tunnel dielectric that is configured to allow and to withstand charge injections by Fowler-Nordheim effect at voltages of around 10 V, for example between 9 V and 12 V, namely a thickness e2 of around 8 nm.

The second part TN and the third part TNs of the dielectric layer OX are formed together on the semiconductor substrate.

The second part TN of the dielectric layer extends from a position located above the junction between the source TEs and the channel region of the state transistor, up to a position located vertically between the source region TEs and the drain region TEd of the state transistor, substantially located between quarter of the way and midway along the channel region.

The third part TNs of the dielectric layer extends from the position located above the junction between the source TEs and the channel region of the state transistor of the second part, up to a position located above the source region of the state transistor TEs, between the state transistor TE and the access transistor TA.

The positions of the inner edges of the source TEs and the drain TEd regions of the state transistor are laterally delimited by the floating gate FG and the control gate CG. Typically, the flanks of the floating gate FG and of the control gate CG are covered by dielectric spacers, which are not shown here.

An injection window INJ is delimited by the intersection of the floating gate FG and the second part TN of the dielectric layer OX, corresponding to a part of the dielectric layer OX having the second thickness e2 located facing the channel region of the state transistor TE.

Thus, the injection window INJ is located vertically between the source region TEs and the drain region TEd, at a distance from the drain region TEd on one side and bordering the source region TEs on the other side.

This arrangement of the injection window INJ makes it possible to produce it with a width LInj that is much smaller than a minimum opening OUV width that can be achieved using a simple etch process, such as for example a wet etch over a mask made of resist.

Specifically, the minimum opening OUV, for example of 0.34 μm, in which the second part TN and the third part TNs of the dielectric layer OX are formed, is partially positioned above the access transistor TA, outside the channel region of the state transistor TE.

This makes it possible both to decrease the width LInj of the injection window INJ, for example to 0.20 μm, and thus to improve the coupling factor of the memory cell and to decrease the overall length of the state transistor TE, for an unchanged effective channel length.

The decrease in the size of the injection window INJ makes it possible both to maximize the coupling factor of the memory cell CEL, and to decrease the length (in the source-drain direction) of the state transistor TE while retaining a constant effective channel length.

Furthermore, the configuration introduced above, in particular with reference to FIG. 2, in which the access transistor TA is connected to the source line SL and the state transistor TE is directly connected to the bit line BL, makes it possible, in return for formulating electrical activation procedures (i.e., erasing and programming procedures) that differ from the typical implementations, to decrease the stresses to which the access transistor TA is subjected and to decrease the size of the access transistor TA.

In this example, the access transistor TA includes a first gate G1 and a second gate G2 which are superposed, according to a structure that is homologous to the structure of the part of the state transistor TE which is located facing the first dielectric layer HV, the first gate G1 and the second gate G2 furthermore being electrically connected.

The term "homologous structure" is understood here and hereinafter to mean that the structures in question are of the same nature, including the same materials, being for example of the same thickness, such as the structures obtained by a common process at different sites.

This configuration has the advantage of being optimal in terms of fabrication process; specifically, the gate dielectric layer HV of the access transistor TA is formed during the same step as the first part HV of the dielectric layer OX of the state transistor TE; the first gate G1 of the access transistor TA is formed during the same step as the floating gate FG of the state transistor TE; a control gate dielectric layer ONO of the access transistor TA is formed during the same step as the control gate dielectric layer ONO of the state transistor TE; the second gate G2 of the access transistor TA is formed during the same step as the control gate CG of the state transistor TE. In addition, the source TAs and drain TAd regions of the access transistor are also formed during the same step as the implantation of the source TEs and drain TEd regions of the state transistor TE. The drain region TAd of the access transistor TA and the source region TEs of the state transistor TE are substantially formed by a single implanted region.

The first gate G1 and the second gate G2 are furthermore electrically connected, allowing the access transistor TA to have a conventional single-gate transistor function.

The length of the state transistor TE, in the source TAs-drain TAd direction, is advantageously less than in typical designs, for example substantially equal to 0.30 μm.

Electrically conductive tracks (for example, made of metal) extending through the interconnect levels of the integrated circuit, linked by electrically conductive vertical vias (for example, made of metal), form in this example the source lines SL and the bit lines BL of the memory plane PM.

For example, the length of a memory cell in this example, from the source line SL to the bit line BL, may be substantially 1.31 μm (in the context of a fabrication process that is simple and relatively inaccurate with respect to processes that are optimized in terms of accuracy but are also complex and expensive).

In summary, this memory cell configuration, including an access transistor coupled via its source region to the corresponding source line, and a state transistor coupled via its drain region to the corresponding bit line, as will be described below in particular with reference to FIG. 8, requires an electrical activation procedure implementing a charge injection by Fowler-Nordheim effect into the floating gate from the channel region of the state transistor, without passing a high erasing or programming voltage through the access transistors, unlike the typical procedures in which the charge is injected from a conduction terminal provided with a capacitive implanted region extending below the injection window, and transmitted via the access transistor. This makes it possible to decrease the size of the access transistor, and to omit the capacitive implanted region (capa implant).

In addition, this injection window design (defined by the intersection of the floating gate and of the second part of the dielectric layer) located on the source region side of the state transistor, made possible by this memory cell configuration, allows the size of the state transistor to be decreased while providing a high degree of reliability and without making the fabrication processes more complex.

Figure 4:
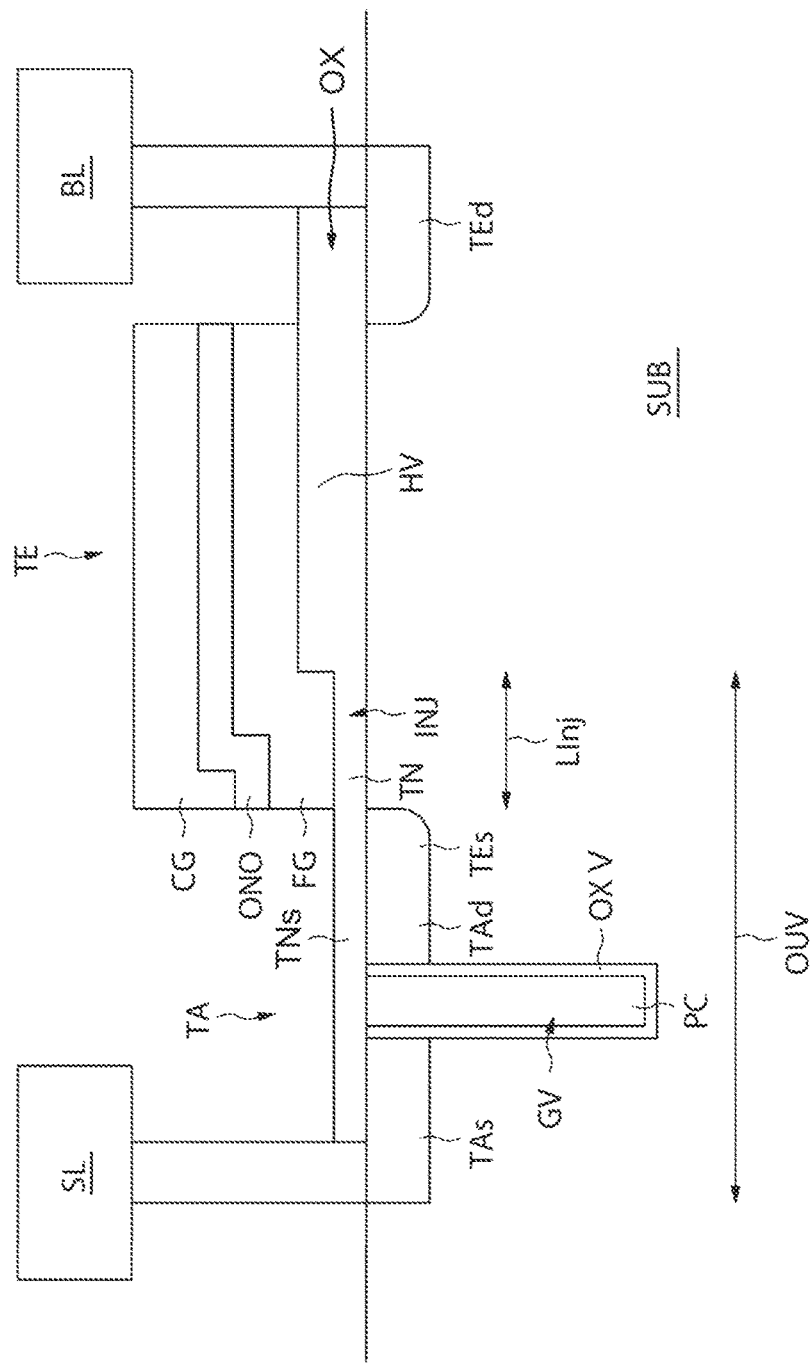

FIG. 4 shows a sectional view of another exemplary embodiment of an EEPROM memory cell CEL.

The state transistor TE is almost identical to the state transistor of the memory cell described above with reference to FIG. 3; the common elements bear the same references and are not described again here.

This embodiment makes use of the decrease in the stresses to which the access transistor TA is subjected.

Specifically, in this example, the access transistor is a vertical gate transistor, less able to withstand high voltages than "planar" transistors of the type of the access transistor TA described above with reference to FIG. 3, but more compact.

Thus, the access transistor includes a vertical gate GV including an electrically conductive central portion PC enveloped by an insulating envelope OXV, formed in a trench. The source TAs and drain TAd regions of the access transistor TA are located on either side of the vertical gate GV at the surface of the substrate SUB.

The insulating envelope, for example made of silicon oxide, thus forms the gate oxide of the access transistor TA, separating the vertical gate from the channel.

The second part TN and the third part TNs of the dielectric layer OX are formed together on the semiconductor substrate.

The second part TN of the dielectric layer extends from a position located above the junction between the source TEs and the channel region of the state transistor, up to a position located vertically between substantially quarter of the way and midway along the channel region.

The third part TNs of the dielectric layer extends, from the second part, over the vertical gate access transistor TA.

The minimum opening OUV (for example of 0.34 µm), in which the second part TN and the third part TNs of the dielectric layer OX are formed, is positioned further above the access transistor TA, outside the channel region of the state transistor TE.

This opening may advantageously cover the vertical gate transistor and also be used to form a second part and a third part of a dielectric layer of a state transistor of a neighboring memory cell there, this cell sharing the same source line SL contact.

This makes it possible both to decrease the width LInj of the injection window INJ, for example to 0.14 µm, and thus to improve the coupling factor of the memory cell and to decrease the overall length of the state transistor TE, for an unchanged effective channel length.

In this example, the source line SL and the bit line BL are also formed by electrically conductive tracks and vias in the interconnect levels of the integrated circuit.

For example, the length of a memory cell in this example, from the source line SL to the bit line BL, may be substantially 0.98 µm (also in the context of a fabrication process that is simple and relatively inaccurate with respect to processes that are optimized in terms of accuracy but are also complex and expensive).

Figure 5:
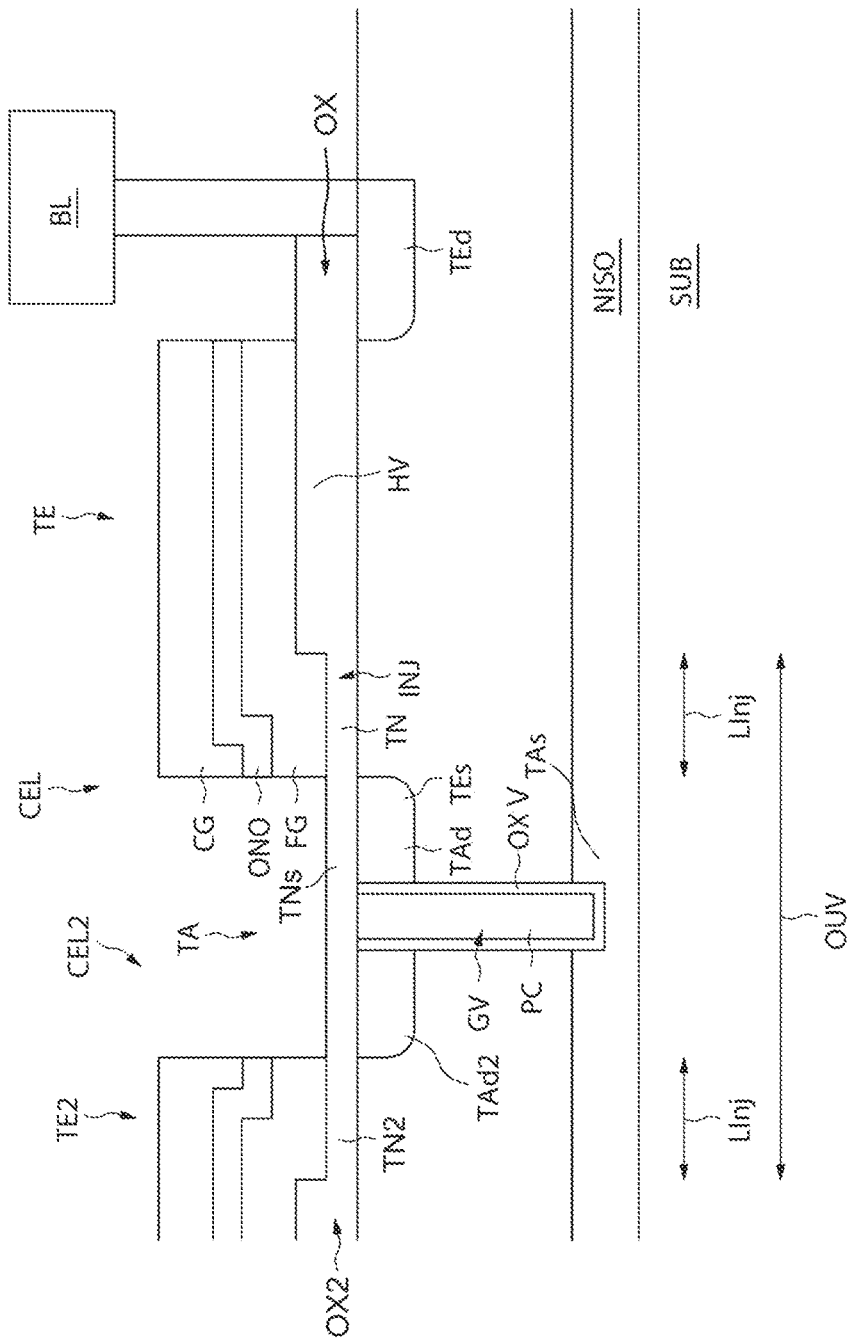

FIG. 5 shows a sectional view of another exemplary embodiment of an EEPROM memory cell CEL.

The state transistor TE is identical to the state transistor of the memory cell described with reference to FIG. 4; the common elements bear the same references and are not described again here.

The access transistor TA in this example is also a vertical gate GV transistor including an electrically conductive central portion PC enveloped by an insulating envelope OXV, formed in a trench.

The vertical gate GV access transistor TA in this example includes a source region TAs that is located in a buried layer NISO, buried at depth in the substrate SUB, the buried layer NISO forming the corresponding source line SL. As regards the drain region TAd of the access transistor TA, it is located at the surface of the substrate SUB.

In addition, the access transistor TA includes a second drain region TAd2, the two drain regions TAd, TAd2 being located on either side of the vertical gate GV at the surface of the substrate SUB, each of the drain regions being connected in series with two state transistors TE, TE2, each belonging to one respective memory cell CEL, CEL2.

The opening OUV, for example here being 0.63 µm, in which the second parts TN, TN2 and the third parts TNs of the dielectric layers OX, OX2 of each of the two state transistors TE, TE2 are formed, is positioned above the access transistor TA and on either side thereof.

This makes it possible both to produce an optimum width LInj of the injection window INJ, for example at 0.14 µm, and thus to decrease the overall length of the pair of state transistors TE, TE2, for unchanged effective channel lengths.

For example, the length of a memory cell CEL, CEL2 in this example, from the buried gate to the bit line BL, may be substantially 0.76 µm (also in the context of a fabrication process that is simple and relatively inaccurate with respect to processes that are optimized in terms of accuracy but are also complex and expensive).

Figure 6:
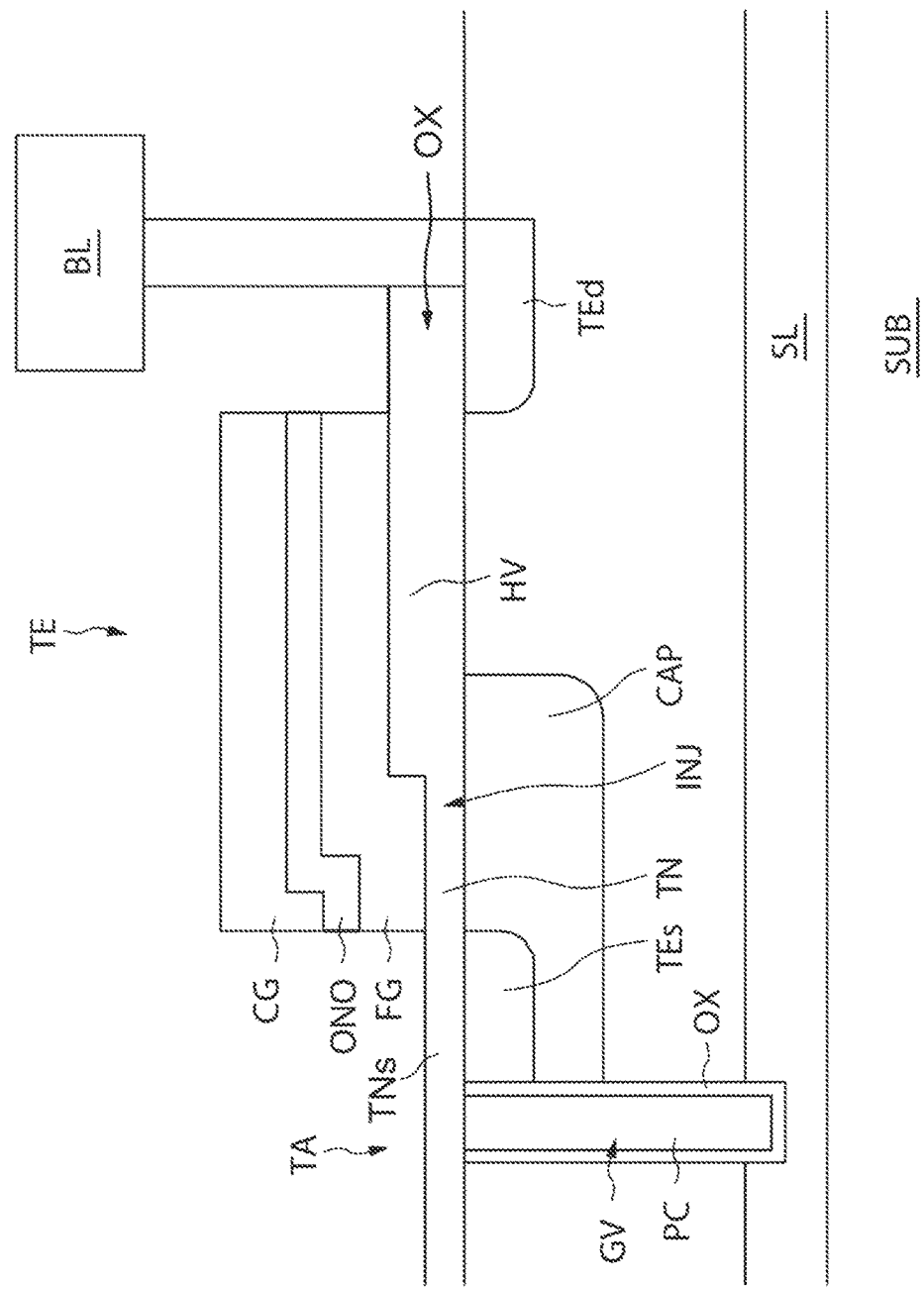

FIG. 6 shows a sectional view of another exemplary embodiment of an EEPROM memory cell CEL.

This example corresponds to the memory cell CEL described above with reference to FIG. 3, in which the state transistor TE further includes a capacitive implanted region CAP (or capa implant) that is located at the surface of the substrate SUB in the vicinity of the source region TEs of the state transistor TE, and extending beyond the injection window and at a distance from the drain region TEd of the state transistor TE.

The capacitive implanted region CAP is optional and may allow reliability and service life to be increased by avoiding potential problems relating to hot-carrier diffusion below the injection window INJ.

This capacitive implanted region CAP is applicable in particular to the various exemplary embodiments described above with reference to FIGS. 3 to 5.

Figures 7, 8:
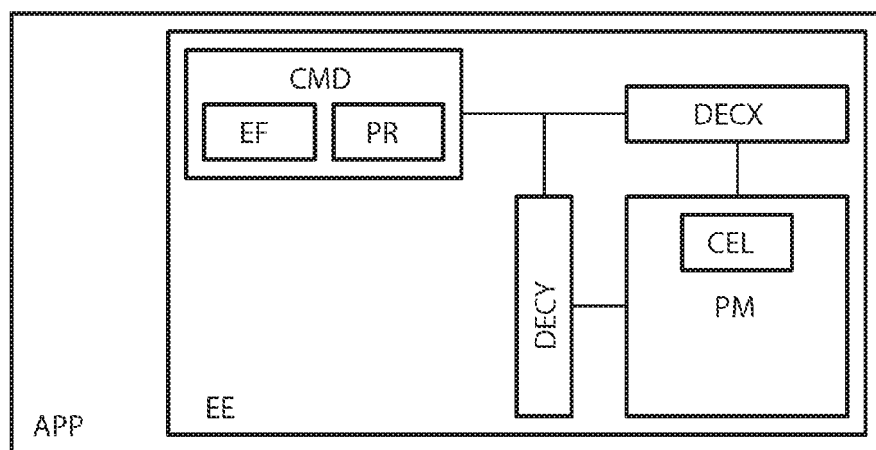
FIGS. 8 and 9A to 9E illustrate exemplary modes of implementation of the invention.

FIG. 7 shows an electronic device, such as a hearing aid or a chip card, including a non-volatile memory EE of electrically erasable and programmable type.

The memory EE includes a memory plane PM, including at least one memory cell CEL comprising a state transistor TE having a source region TEs, a drain region TEd, a control gate CG and a floating gate FG, and an access transistor TA having a source region TAs, a drain region TAd and a gate G1-G2, GV, the source region TAs of the access transistor being coupled to a source line SL, the drain region TAd of the access transistor and the source region TEs of the state transistor being common, the drain region TEd of the state transistor being coupled to a bit line BL. The floating gate FG of the state transistor rests on a dielectric layer OX having a first part HV with a first thickness e1, and a second part TN with a second thickness e2 that is less than the first thickness e1, the second part TN being located on the source region TEs side of the state transistor TE.

The memory EE further includes a column decoder DECX and a line decoder DECY, as well as control circuit.

The control circuit CMD includes the erase circuit EF and the programming PR circuit.

The erase circuit EF is intended to implement the memory cell erasures, by transmitting voltage signals in particular over the control gate CG lines, the bit lines BL, the word lines WL and the source lines SL, by routing via the line DECY and column DECX decoders.

As shown in FIG. 8, the erase circuit EF is configured, during an erasure, to transmit a negative erasing voltage over a control gate line CGT that is coupled to the control gate CG of the state transistor TE of a memory cell CEL, so as to place the state transistor TE in an on state.

The erase circuit EF may also transmit a zero voltage over a word line WL coupled to the gate of the access transistor TA of the memory cell CEL, so as to order the access transistor TA to assume an off state.

The value of the erasing voltage is in this example −15 V. Optionally, a voltage of −2 V is applied to the other control gate lines CGT, with a view to minimizing the breakdown stresses on the transistors belonging to the line DECY and column DECX decoders. In relation to the erasure per se of a memory cell, this voltage of −2 V could be zero.

The control circuit CMD is, for example, configured to implement a write operation comprising a collective erasure of a group of memory cells, followed by an operation of selectively programming this group of memory cells.

The group of memory cells may include for example a minimum of one word of memory cells, and a maximum of one entire page.

The programming circuit PR is intended to implement memory cell programming operations, by transmitting voltage signals in particular over the control gate CG lines, the bit lines BL, the word lines WL and the source lines SL, by routing via the line DECY and column DECX decoders.

As shown in FIG. 8, the programming circuit PRG is configured, during a programming operation, to transmit a positive programming voltage over a control gate line CGT coupled to the control gate CG of the state transistor TE belonging to a memory cell CEL, and, simultaneously, to transmit, over the bit line BL coupled to the drain region TEd of the state transistor, either a programming-inhibiting voltage so that the state transistor TE is not placed in an off state, or a programming-allowing voltage so as to place the state transistor TE in an off state.

The high potential of the control gate generates, by capacitive coupling, a high potential on the floating gate, such that the state transistor is placed in an on state.

The voltage at the drain TEd of the state transistor is then transferred in the same way to the source TEs of the state transistor.

A programming-allowing voltage having a zero value on the bit line generates a zero voltage on the source TEs, the potential difference through the injection window INJ is of the order of 10 V, the floating gate is then discharged by Fowler-Nordheim effect.

A programming-inhibiting voltage having a positive value on the bit line generates a similar positive voltage on the source TEs, the potential difference through the injection window INJ is of the order of 10 V minus the inhibiting voltage, namely 10 V−5 V=5 V, which value is insufficient for generating a significant Fowler-Nordheim current, thereby blocking (or inhibiting) the discharge of the floating gate.

This corresponds for example to a selective programming of the memory cells belonging to the group of memory cells.

The programming circuit may furthermore transmit a zero voltage over a word line WL coupled to the gate of the access transistor TA, so as to order the access transistor TA to assume an off state.

The value of the programming voltage is, in this example, +15 V, the value of the programming-inhibiting voltage is +5 V and the value of the programming-allowing voltage is 0 V. Optionally, a voltage of +3 V is applied to the other control gate CG lines, with a view to minimizing the breakdown stresses on the transistors belonging to the line DECY and column DECX decoders, and a voltage of +1 V is applied to the source line, with a view to optimizing leakage prevention in the access transistors. In relation to the programming per se of a memory cell, these voltages of +3 V and +1 V could be zero.

FIGS. 9A to 9E show sectional views of results of steps of a process for fabricating EEPROM memory cells, in and on a semiconductor substrate SUB having a first conductivity type.

Figure 9A:
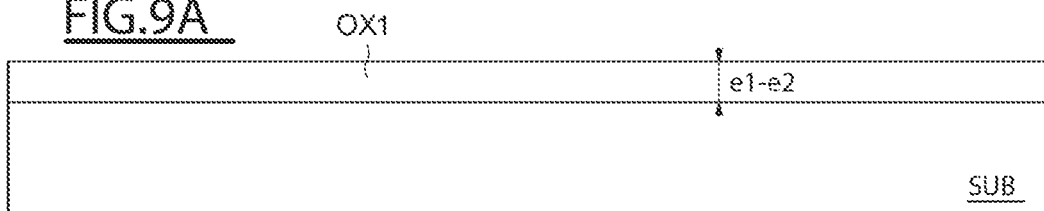

FIG. 9A shows the result of forming a first dielectric layer OX1. The thickness of the first dielectric layer OX1 is equal to the difference e1−e2 between a first thickness e1 and a second thickness e2, which is less than the first thickness e1.

This formation of the first dielectric layer OX1 may comprise, for example, a deposition or growth of a dielectric material such as silicon oxide on the surface of the substrate SUB.

Figure 9B:
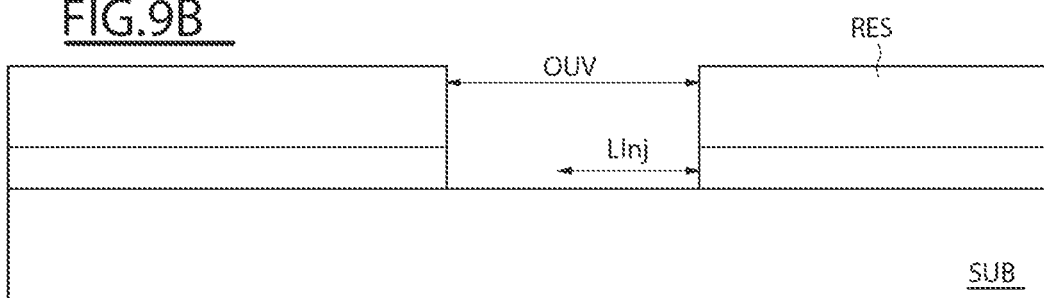

FIG. 9B shows the result of a lithography operation comprising placing a mask RES having an opening OUV and etching the first dielectric layer OX1 located facing the opening OUV, down to the surface of the substrate SUB.

For example, the placement of the mask RES comprises a deposition of a thick resist layer RES, the opening OUV in which results from targeted exposure to radiation and removal of the irradiated or non-irradiated zones.

The etching of the first dielectric layer OX1 is a wet-etching operation.

Figure 9C:
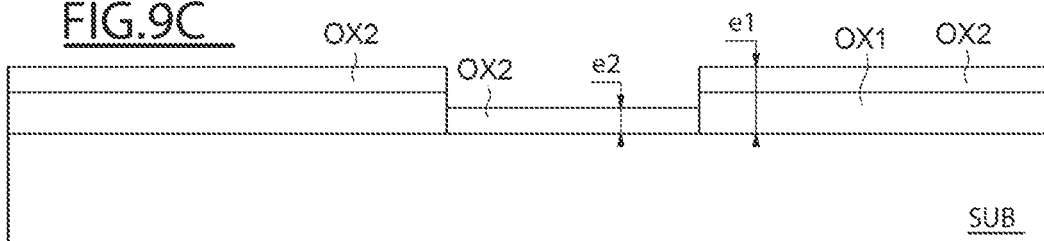

FIG. 9C shows the result of forming a second dielectric layer OX2 having a second thickness e2, less than the first thickness e1, in the etched part of the first dielectric layer OX1 and above the first dielectric layer OX1.

This formation of the second dielectric layer OX2 may comprise for example a deposition or a growth of a dielectric material such as silicon oxide.

In relation with the embodiments described above, the superposition of the first dielectric layer OX1 and of the second dielectric layer OX2 corresponds to the first part (HV) of the dielectric layer (OX), and the second dielectric layer OX2 located in the etched part corresponds to the second part (TN) and the third part (TNs) of the dielectric layer (OX).

Figure 9D:
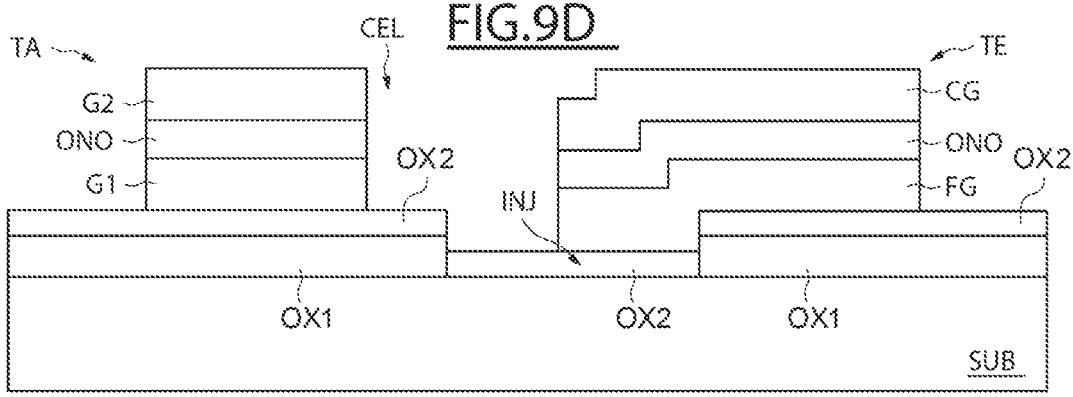

FIG. 9D shows the result of forming a floating gate FG and forming a control gate CG facing the floating gate FG.

The gates FG, CG are for example made of doped polycrystalline silicon (polysilicon).

For example, the production of the floating gate FG and of the control gate CG comprises forming a first polysilicon layer (FG, G1) and etching this layer so as to separate the floating gates of two neighboring memory cells (the etch being located in a plane that is parallel to the sectional plane of FIG. 9D, not shown).

Next, the production operation comprises forming a control gate dielectric layer ONO (including for example an alternation of silicon oxide and silicon nitride layers) and forming a second polysilicon layer (CG, G2).

Lastly, the production operation comprises etching, down to the second dielectric layer OX2, the second polysilicon layer (CG, G2), the control gate dielectric layer ONO and the first polysilicon layer (FG, G1), along strips extending in a direction that is perpendicular to the sectional plane of FIG. 9D.

This last etch forms strips in the second polysilicon layer, one forming a control gate CG common to the state transistors of the memory cells of one and the same memory word, the other forming a second gate G2 common to the access transistors TA of the memory cells of this memory word.

The etching of the polysilicon layers is implemented such that the floating gate FG rests on a part of the second dielectric layer OX2 located at the site of the opening OUV and on the stack of the first and of the second dielectric layers OX1, OX2.

The etching of the polysilicon layers is also implemented so as to form a superposition of a first gate G1 and of a second gate G2 of an access transistor TA. The superposition of the first gate G1 and of the second gate G2 is located above a stack of the first dielectric layer OX1 and of the second dielectric layer OX2.

Figure 9E:
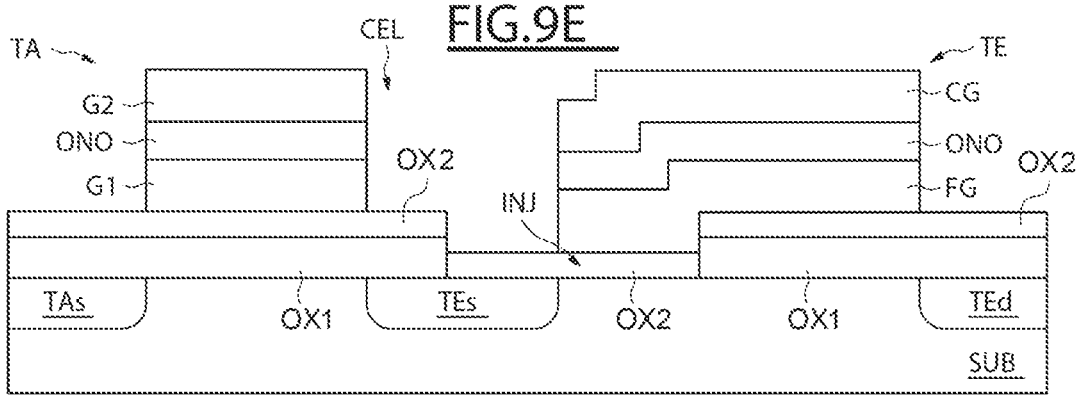

FIG. 9E shows the result of a step of implanting dopants of a second conductivity type, opposite the first conductivity type, into the surface of the substrate SUB, forming in particular the source region TEs and the drain region TEd of the state transistor TE, and the source region TAs and the drain region of the access transistor TA, shared with the source region TEs of the state transistor.

During the implantation operation, the stack of the floating gate FG and the control gate CG, and the stack of the first gate G1 and the second gate G2, act as hardmasks for positioning the source TEs, (TAs) and drain TEd, TAd regions.

This result corresponds to the exemplary embodiment described above with reference to FIG. 3, in particular the formation of the state transistor TE.

Thus, a first gate G1 of the access transistor TA has been formed at the same time as the formation of the floating gate FG and a second gate G2 of the access transistor TA has been formed at the same time as the formation of the control gate CG. A layer ONO separating the first gate G1 and the second gate G2 has been formed at the same time as the formation of the control gate dielectric layer ONO of the state transistor TE.

For example, an opening is formed in the second gate G2 and the control gate dielectric layer ONO, exposing a part of the first gate G1. A contact is formed on the exposed parts of the first gate G1 and of the second gate G2, respectively, so as to electrically connect them by means of a metal in a metallization level (for example at the level of the word line WL).

Stated otherwise, an access transistor having a structure that is homologous to the structure of the part of the state transistor TE which is located facing the first dielectric layer OX1 has been fabricated in steps inserted before or after or implemented during the steps of fabricating the state transistor TE.

Furthermore, the process may comprise forming electrically conductive bit lines BL in interconnect levels of the integrated circuit, which are linked to the drain region TEd of the state transistors TE by electrically conductive vertical vias, and forming electrically conductive source lines SL that are linked to the source region TAs of the access transistors TA.

The formation of the source lines may include forming electrically conductive tracks in the interconnect levels of the integrated circuit which are linked by electrically conductive vertical vias, or implanting a semiconductor buried layer having the second conductivity type at depth in the substrate (in the case in which the access transistor is a vertical gate transistor, such as described above with reference to FIG. 5).

Moreover, the invention is not limited to these embodiments, but encompasses all variants thereof; for example, the dimensions of the memory cell embodiments have been provided by way of example, within the context of a given fabrication technique, and may of course be smaller with respect to the capability of the technology used.

In addition, the process for fabricating the memory device described above, in particular with reference to 9A to 9E, in no way limits the structure of the device; for example, in the context of finer etching techniques, the third part of the dielectric layer may not be formed, while benefiting from the advantages of the decrease in size which relate to the structure of the device and which are mentioned above, in particular with reference to FIG. 3.

What is claimed is:

1. An electrically erasable and programmable non-volatile memory device formed at a surface of a semiconductor substrate, the memory device comprising:
   a plurality of bit lines;
   a plurality of source lines; and
   a memory plane including a plurality of memory cells, each memory cell comprising a state transistor having a source region, a drain region, a control gate and a floating gate, each memory cell also comprising an access transistor having a source region, a drain region and a gate;
   wherein the source region of each access transistor is coupled to a source line of the plurality of source lines;
   wherein the drain region of the access transistor and the source region of the state transistor are common;
   wherein the drain region of each state transistor is coupled to a bit line of the plurality of bit lines; and
   wherein the floating gate of each memory cell overlies a dielectric layer having a first part with a first thickness and a second part with a second thickness that is less than the first thickness, the second part being located on a source region side of the state transistor, wherein the state transistor is configured to be, during a programming operation and an erase operation, undergo charge injections by Fowler-Nordheim effect through the second part.

2. The memory device according to claim 1, wherein the dielectric layer includes a further third part extending beyond the floating gate, located above and overlapping with the source region of the state transistor and having a third thickness that is equal to the second thickness.

3. The memory device according to claim 1, further comprising an erase circuit that is configured, during the erase operation, to transmit an erasing voltage to the control gate of the state transistor.

4. The memory device according to claim 3, wherein the erase circuit is configured, during the erase operation, to transmit a zero voltage to the gate of the access transistor.

5. The memory device according to claim 1, comprising a programming circuit that is configured, during the programming operation, to transmit a programming voltage to the control gate of the state transistor, and to simultaneously transmit, over the bit line coupled to the drain region of the state transistor, either a programming-inhibiting voltage, or a programming-allowing voltage.

6. The memory device according to claim 5, wherein the programming circuit is configured, during the programming operation, to transmit a zero voltage to the gate of the access transistor so as to cause the access transistor to assume an off state.

7. The memory device according to claim 1, wherein each access transistor includes a first gate and a second gate that are superposed, according to a structure that is homologous to the structure of a part of the state transistor that is located facing the dielectric layer, the first gate and the second gate being electrically connected.

8. The memory device according to claim 1, wherein each access transistor includes a vertical gate comprising an electrically conductive central portion enveloped by an insulating envelope in a trench, the source and drain regions of the access transistor being located on either side of the vertical gate at the surface of the substrate.

9. The memory device according to claim 1, wherein each access transistor includes a vertical gate comprising an electrically conductive central portion enveloped by an insulating envelope in a trench, the drain region of the access transistor being located at the surface of the substrate and the source region of the access transistor being located in a buried layer, buried at depth in the substrate, the buried layer forming the corresponding source line.

10. The memory device according to claim 1, wherein each state transistor includes a capacitive implanted region located below the second part of the dielectric layer and below a portion of the first part of the dielectric layer.

11. An electrically erasable and programmable non-volatile memory device comprising:
a plurality of memory cells arranged in rows and in columns of memory words, each memory word including N memory cells on one and the same row, wherein each memory cell comprises a state transistor having a source region, a drain region, a control gate and a floating gate and also comprises an access transistor having a source region, a drain region and a gate;
at least one source line coupled to the memory cells;
a number (N) of bit lines per column, each bit line being coupled to a memory cell of each memory word of a column;
a control gate line per column coupled to the control gates of the state transistors of the memory cells belonging to this column; and
a word line per row coupled to the gates of the access transistors of the memory cells belonging to this row;
wherein the source region of each access transistor is coupled to the at least one source line;
wherein the drain region of the access transistor and the source region of the state transistor are common;
wherein the drain region of each state transistor is coupled to the bit line associated with that memory cell; and
wherein the floating gate of each memory cell overlies a dielectric layer having a first part with a first thickness and a second part with a second thickness that is less than the first thickness, the second part being located on a source region side of the state transistor, wherein the state transistor is configured to be, during a programming operation and an erase operation, undergo charge injections by Fowler-Nordheim effect through the second part.

12. The memory device according to claim 11, further comprising an erase circuit that is configured, during an erasure, to transmit an erasing voltage over the control gate line that is coupled to the control gates of the state transistors of the memory cells of a group of memory cells.

13. The memory device according to claim 12, wherein the erase circuit is configured, during the erasure, to transmit a zero voltage over the word line that is coupled to the gates of the access transistors of the memory cells of the group of memory cells.

14. The memory device according to claim 11, further comprising a programming circuit that is configured, during a programming operation, to transmit a programming voltage over the control gate line that is coupled to the control gates of the state transistors of the memory cells of a group of memory cells, and, simultaneously, to transmit a programming-inhibiting voltage or a programming-allowing voltage over the bit lines that are respectively coupled to memory cells of this group of memory cells.

15. The memory device according to claim 14, wherein the programming circuit is further configured, during the programming operation, to transmit a zero voltage over the word line that is coupled to the gates of the access transistors of the memory cells of the group of memory cells.

16. The memory device according to claim 11, wherein the memory device is formed at a surface of a substrate and wherein each access transistor includes a vertical gate comprising an electrically conductive central portion enveloped by an insulating envelope in a trench, the drain region of the access transistor being located at the surface of the substrate and the source region of the access transistor being located in a buried layer, buried at depth in the substrate, the buried layer forming the corresponding source line.

17. The memory device according to claim 16, wherein the drain region of each access transistor is located on either side of the vertical gate at the surface of the substrate, and is connected in series with the source regions of two state transistors belonging respectively to two memory cells located on either side of the access transistor.

18. An electronic device that includes the memory device according to claim 11, wherein the electronic device is a mobile telephone or a hearing aid.

19. An electrically erasable and programmable non-volatile memory device comprising:
a floating gate transistor comprising a source region, a drain region, a first dielectric layer, a control gate, a second dielectric layer, and a floating gate, the first dielectric layer being disposed between a surface of a semiconductor substrate and the floating gate, the second dielectric layer being disposed between the floating gate and the control gate, the first dielectric layer having a first part with a first thickness and a second part with a second thickness that is less than the first thickness, the second part being disposed directly over the source region of the floating gate transistor, the floating gate having a substantially uniform thickness, the drain region of the floating gate transistor being coupled to a bit line of a plurality of bit lines, wherein the floating gate transistor is configured to be, during a programming operation and an erase operation, undergo charge injections by Fowler-Nordheim effect through the second part; and
an access transistor having a source region, a drain region and a gate, the drain region of the access transistor and the source region of the floating gate transistor sharing a common region, wherein the source region of the access transistor is coupled to a source line of a plurality of source lines.

20. The memory device according to claim 19, wherein the gate of the access transistor comprises a vertical gate disposed in the semiconductor substrate, the drain region of the access transistor and the source region of the access transistor located at the surface of the substrate.

21. The memory device according to claim 19, wherein the source line is disposed above the substrate.

22. The memory device according to claim 19, wherein the control gate comprises a first region with a third thickness overlaying a portion of the first part of the first dielectric layer and a second region with a fourth thickness overlaying the second part of the first dielectric layer, the fourth thickness being larger than the third thickness.

* * * * *